United States Patent [19]
Ozaki

[11] Patent Number: 5,703,884
[45] Date of Patent: Dec. 30, 1997

[54] SCANNING PASS TEST CIRCUIT

[75] Inventor: Hideharu Ozaki, Tokyo, Japan

[73] Assignee: NEC Corporation, Tokyo, Japan

[21] Appl. No.: 665,538

[22] Filed: Jun. 18, 1996

[30] Foreign Application Priority Data

Jun. 23, 1995 [JP] Japan ................................. 7-180736

[51] Int. Cl.[6] ................................................ G01R 31/28
[52] U.S. Cl. ................... 371/22.3; 371/22.5; 395/183.06
[58] Field of Search ........................... 371/22.3, 25.1,
371/22.4, 22.5; 324/158 R, 73.1, 765; 377/80;
327/203, 296; 395/183.06, 183.18

[56] References Cited

U.S. PATENT DOCUMENTS

| | | | |
|---|---|---|---|
| 4,897,837 | 1/1990 | Ishihara et al. | 371/22.3 |
| 4,942,577 | 7/1990 | Ozaki | 371/22.3 |
| 5,130,647 | 7/1992 | Sakashita et al. | 324/158 R |
| 5,257,267 | 10/1993 | Ishizaka | 371/22.3 |
| 5,367,551 | 11/1994 | Okumura et al. | 377/80 |
| 5,378,934 | 1/1995 | Takahashi et al. | 327/203 |

*Primary Examiner*—Robert W. Beausoliel, Jr.
*Assistant Examiner*—Nadeem Iqbal
*Attorney, Agent, or Firm*—Whitman, Curtis, Whitman & McGinn

[57] ABSTRACT

A shift register constituting a scanning pass test circuit is divided into a plurality of groups, and bypass selectors are inserted into the divided positions of the shift register. A latch circuit is connected to each of the clock signal terminals of the flip-flop circuits which are disposed at the first stage of the flip-flop circuit groups.

5 Claims, 2 Drawing Sheets

1

SCANNING PASS TEST CIRCUIT

BACKGROUND OF THE INVENTION

1. Field of the Invention

The present invention relates to a semiconductor integrated logic circuit, more particularly to a scanning pass test circuit which is capable of operating as a shift-register circuit in which a plurality of flip-flop circuits are connected in series.

2. Description of the Prior Art

A conventional semiconductor logic integrated circuit mounting a scanning pass system is shown in FIG. 2, in which a plurality of flip-flop circuits are connected in series like a shift-register and test operations for a combination circuit are made easier by reading out operation results after supplying test signals to the flip-flop circuits from an external terminal. Referring to FIG. 2, for example, first to m-th flip-flop circuits (37 to 39) (m: a prescribed positive integer) are arranged in the semiconductor integrated logic circuit. The flip-flop circuits (37 to 39) are connected in series. First, selectors 33 to 36 are interposed between the respective flip-flop circuits. The flip-flop circuits connected in series constitute a scanning pass test circuit which operates as a shift-register circuit. In more detail, at a scanning pass test time, a scanning mode control terminal 32 is set at a test side, that is, the terminal 32 is set at a prescribed logic value. Scanning pass test signals are sequentially supplied from a scanning-in terminal 30 to the selector 33. The input and output terminals of the first to the m-th flip-flop circuits (37 to 39) are set in certain states. Signals are output from a scanning-out terminal 40 sequentially. Thus, the values of the first to m-th flip-flop circuits (37 to 39) are read out so that the tests for the combination circuit 41 are conducted.

At the time of the scanning pass test, for test patterns (hereinafter referred to as a scanning pass test pattern) to sequentially transfer the scanning pass test signals and to sequentially read out to verify, the scanning pass test patterns as many as corresponding to the number of the flip-flop circuits constituting the scanning pass test circuit have been required at the time of reading out. Various kinds of the scanning pass test patterns have been provided for the scanning pass test.

The foregoing conventional semiconductor integrated logic circuit is constituted so that the scanning pass test patterns as many as the flip-flop circuits are input, that is, serially input. In general, it is impossible to test the whole logic of the combination circuits with one test pattern by using the scanning pass test technique. For this reason, it is not necessary to set the value for all flip-flop circuits and to read them out in one test.

In the foregoing conventional semiconductor integrated logic circuit, however, it is impossible to conduct the test, using the scanning pass test technique, for the whole logic of the combination circuit with one test pattern. For this reason, it is not necessary to set the values of all of the flip-flop circuits at one test.

However, in the foregoing conventional semiconductor integrated logic circuit, it is required to input the values for all of the flip-flop circuits as the test patterns from the scanning-in terminal 30 and to read out the results from all of the flip-flop circuits. Therefore, when the semiconductor integrated logic circuit using the scanning pass test technique is tested, there is a problem with an extreme increase in a memory capacitance required for a test apparatus (an LSI tester).

SUMMARY OF THE INVENTION

The object of the present invention is to provide a semiconductor integrated logic circuit which is capable of eliminating the foregoing problem and of reducing the number of test patterns in the scanning pass test technique.

To achieve the foregoing object, the present invention provides a semiconductor integrated logic circuit which comprises a plurality of flip-flops circuits which are divided into a plurality of flip-flop circuit groups, the plurality of the flip-flop circuit constituting a shift register which serves as a scanning pass circuit; means for bypassing selectively the aforementioned plurality of the flip-flop circuit groups; and means for controlling the aforementioned flip-flop circuits included in the bypassed flip-flop circuit group so as not to operate.

The semiconductor integrated logic circuit of the present invention is characterized in that a bypass selector circuit for selectively bypassing the flip-flop circuit group is inserted into the final stage of the flip-flop circuit group, and clock signal terminals of the flip-flop circuits included in the aforementioned flip-flop circuit group selectively bypassed are set at a latched state when the aforementioned selector circuit for bypassing the flip-flop circuit group makes the aforementioned flip-flop circuit group a non-selective state.

According to the present invention, a bypass selector is inserted between a plurality of flip-flop circuits constituting a scanning pass test circuit so that the scanning pass test circuit is divided. A latch circuit is connected to a clock signal terminal of each of the flip-flop circuits. With such constitution, a scanning test pattern is inputted from a scanning-in terminal, and a test signal is applied to a combination circuit via a scanning pass (a shift register composed of flip-flops). An output signal is outputted from the combination circuit to a scanning-out terminal via the scanning pass. The number of clock signals required for the above operation is greatly reduced to more than 50% of the conventional semiconductor integrated logic circuit. Therefore, a pattern length of the scanning test pattern (a pattern size) is largely reduced. According to the present invention, the supply of the clock signals to the flip-flop circuit groups divided by the latch circuit is controlled so that it is possible to suppress unnecessary operations of the flip-flops and to avoid the operations of the circuits other than the tested object circuit among the combination circuit. As a result, a high precision test is possible by reducing switching noise.

BRIEF DESCRIPTION OF THE DRAWINGS

An embodiment of the present invention will now be described by way of example and with reference to the accompanying drawing, in which.

DETAILED DESCRIPTION OF THE PREFERRED EMBODIMENT

Figure 1:
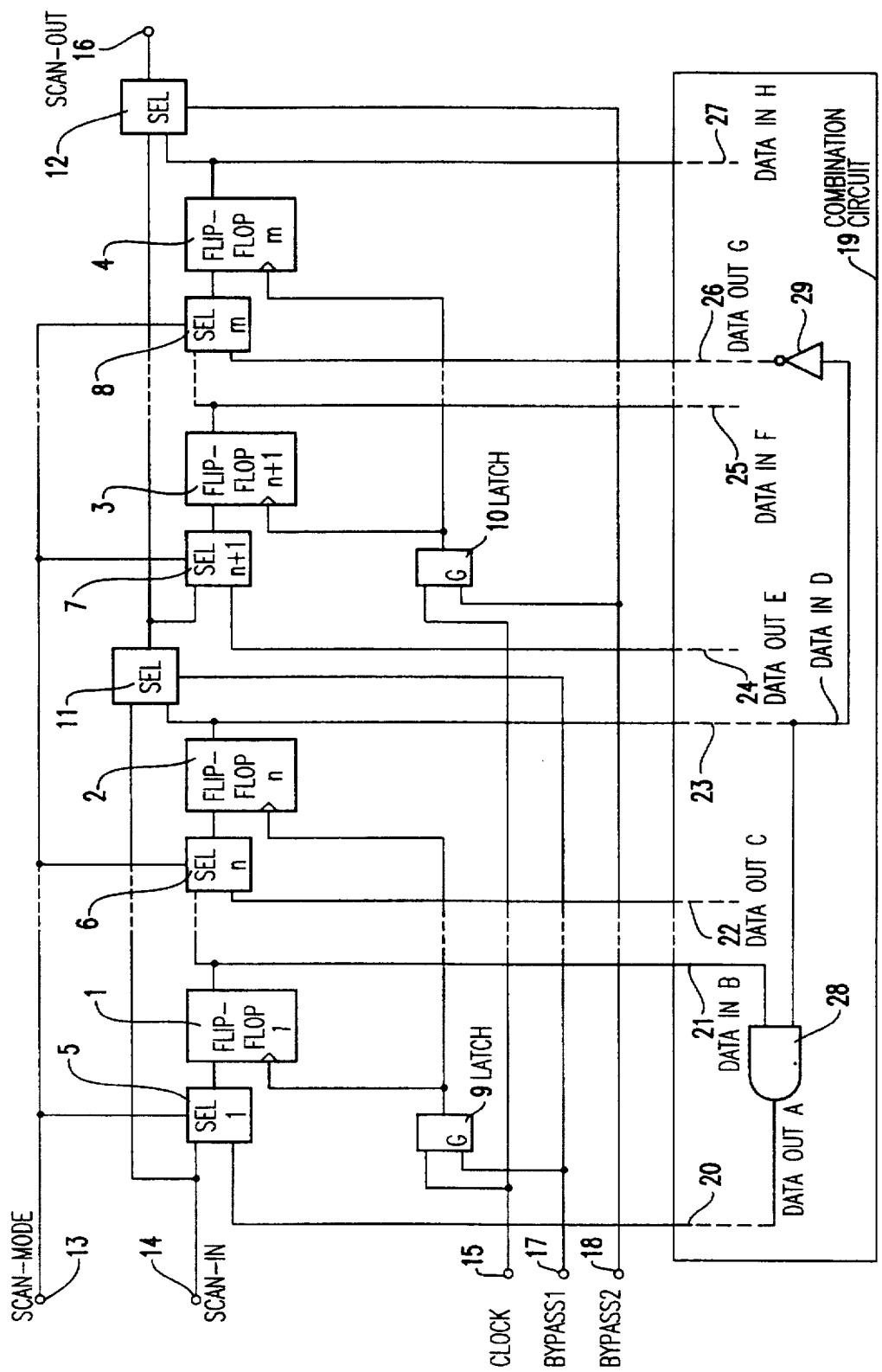
FIG. 1 is a block diagram showing a constitution of an embodiment according to the present invention.

Referring to FIG. 1 which shows a first embodiment of the present invention, which shows a first embodiment of the present invention the first to n-th flip-flop circuits (1 to 2) (n: a prescribed positive integer more than one) constitute a first flip-flop circuit group, in which the first to n-th flip-flop circuits (1 to 2) are connected in series. The (n+1)th to m-th flip-flop circuits (3 to 4) (m: a prescribed positive integer more than n+1) constitute a second flip-flop circuit group, in which the (n+1)th to m-th flip-flop circuit (3 to 4) are connected in series. The first to n-th selectors (5 to 6) are arranged corresponding to the first flip-flop circuit group. The (n+1)th to m-th selectors (7 to 8) are arranged corresponding to the second flip-flop circuit group. Furthermore, selectors 11 and 12 are arranged between a scanning-in terminal 14 and a scanning-out terminal 16. The first and second flip-flop circuit group constitute a shift register at a scanning pass test via the selectors.

The selector 11 is inserted between the first and second flip-flop circuit groups. The selector 11 receives one of an output from the n-th flip-flop circuit 2 and a signal from the scanning-in terminal 14 and outputs selectively either the output from the n-th flip-flop circuit 2 or the signal from the scanning-in terminal 14. The output terminal of the selector 11 is connected to one input terminal of the selector 12 and one input terminal of the (n+1)th selector 7 which is a first stage of the second flip-flop circuit group. It is noted that the selectors 11 and 12 bypass the first and second flip-flop circuit groups by selectively outputting data. The selectors 11 and 12 are also called a selector circuit.

The clock input terminals of the first to n-th flip-flop circuits (1 to 2) are commonly connected to the output terminal of a first latch circuit 9, and the clock input terminals of the (n+1)th to the m-th flip-flop circuits (3 to 4) are connected together to the output terminal of a second latch circuit 10. Data input terminals of the first and second latch circuits 9 and 10 are connected together to the clock signal terminal 15.

The selection control signal terminal of the selector 11 is connected to a first bypass signal terminal 17 together with the gate signal terminal of the first latch circuit 9. Similarly, the selection control signal terminal of the selector 12 is connected to a second bypass signal terminal 18 together with the gate signal terminal of the second latch circuit 10.

With such constitution, when an AND (logic product) circuit 28 incorporated in the combination circuit 19 is subjected to the test, test input signals b and d are applied to the input terminals of the AND circuit 28 from the test data input terminal 21 and the test data input terminal 23 and the output data a at the output terminal of the AND circuit 28 is observed.

The scanning mode control terminal 13 is set such that the first to the m-th flip-flop circuits (1 to 4) constitute a shift register. With such constitution, the first flip-flop circuit 1 can set the value to be supplied to the test data input b 21 (logic value) and then the flip-flop circuit 2 can set the value to be supplied to the test data input d 23. Specifically, among the first to the m-th selectors, the first selector 5 outputs selectively the scanning-in terminal 14, and the (n+1)th selector 7 selects the output from the selector 11. Other selectors selectively produce the output from the corresponding flip-flops arranged in the pre-stages of the respective selectors.

A first bypass signal 17 is set to a prescribed logic value such that data passes through a first latch circuit 9 without being latched by the latch circuit 9 (a clock signal 15 inputted to the first latch circuit 9 is outputted therefrom without being latched) and the selector 11 can select the output from the n-th flip-flop circuit. Thereafter, the value to be supplied to the test data input terminal 23 for the first clock input to the clock signal terminal 15 is input to the scanning-in terminal 14. The logic value to be supplied to the test data input terminal 21 for the n-th clock signal input to the clock signal terminal 15 is input to the scanning-in terminal 14. Thus, the AND circuit 28 can be operated. Specifically, with the n-th clock signal, the test data input d 23 and the test data input b 21 are supplied simultaneously to the two input terminals of the AND circuit 28.

In this case, the value of the second bypass signal 18 inputted to the gate of the second latch circuit 10 is set such that the second latch circuit 10 is rendered to be a hold state in which the second latch circuit 10 latches the clock signal which was input thereto immediately before newly input clock signal 15 and the clock signal 15 is not transferred. Thus, the test data input f and the test data input h are not changed so that the circuits other than the AND circuit 28, which is the test object circuit of the combination circuit 19, do not operate.

Since the operation result of the AND circuit 28 can be obtained by observing the test data output a, the scanning mode control 13 is set such that the first to the m-th flip-flop circuits (1 to 4) do not constitute the shift register by being connected in series, that is, the first to the m-th selectors (5 to 8) output selectively the test data outputs a, c, e, and g from the combination circuit 19, respectively. By inputting the clock signal 15 as many as one clock, the value of the test data output a 20 is set in the first flip-flop circuit 1.

Next, the scanning mode control 13 is set such that the first to the m-th flip-flop circuits (1 to 4) constitute the shift register by being connected in series. Specifically, the first selector 5 outputs selectively the scanning-in, and other selectors output selectively the outputs from the flip-flops respectively disposed in the pre-stages of the corresponding selectors. The value of the second bypass signal 18 is set such that the selector 12 selectively outputs the output from the selector 11, that is, the (n+1)th to the m-th flip-flops circuits (2 to 4) are bypassed.

Subsequently, by supplying n clock signals to the clock signal terminal 15, the value of the test data output a transmits through the n flip-flops connected in series, than the data is outputted from the scanning-out terminal 16 through the selectors 11 and 12.

In this embodiment of the present invention, one test for the AND circuit 28 can be carried out with the clock signals (2n+1) times. That is, the n clock signals for applying simultaneously the test data input d and the test data input b to the two input terminals of the AND circuit 28 from the scanning-in terminal 14 are required. The (n+1) clock signals are required until the test data output a 20 from the output terminal of the AND circuit 28 is outputted to the scanning-out terminal 40. Therefore, one test is carried out with (2n+1) clock cycle.

To test a two input AND circuit in general, four tests: (0, 0), (1, 0), (1, 1) and (0, 1) are necessary. In this embodiment, 4×(2n+1) clock signals are necessary.

Figure 2:
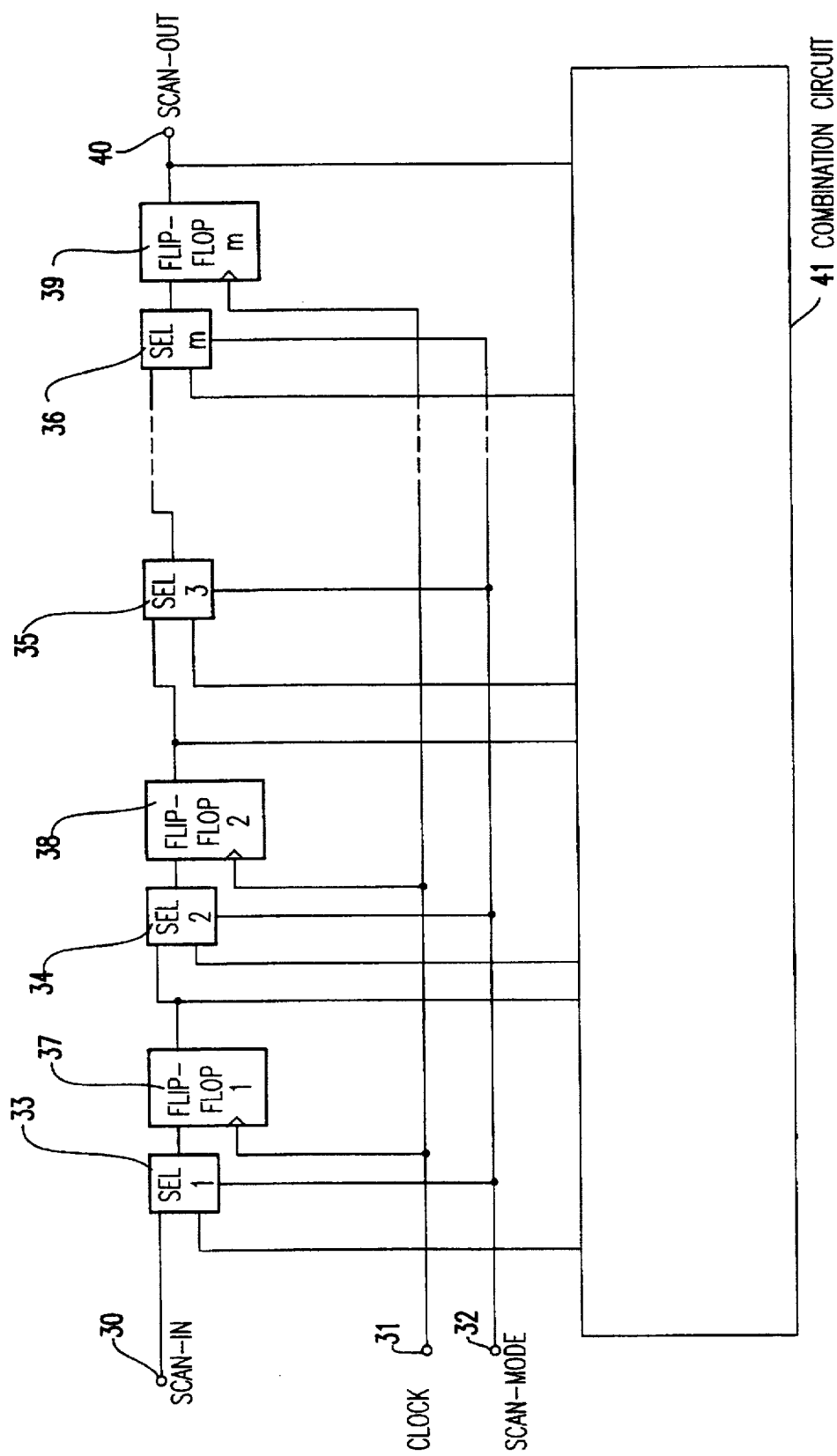
FIG. 2 is a block diagram showing a conventional circuit constitution.

On the other hand, in the foregoing conventional semiconductor logic circuit shown in FIG. 2, when the number of the stages of the flip-flop circuits is the same as that of the this embodiment, 4×(2m+1) clock signals are necessary. Here, an inequality m>n+1 must be satisfied. In this embodiment, when the selector 11 is inserted approximately at the central portion of the shift register which constitutes the scanning pass test circuit, n becomes approximately half of m. Thus, the number of the clock signals required for the combination circuit is reduced to half of that of the foregoing conventional semiconductor integrated logic circuit, and the pattern length of the scanning pass test pattern is reduced.

Similarly, to test an inverter 29 which constitutes a part of the combination circuit, when data is input, the value of the first bypass signal 17 is set such that the first latch circuit 9 is rendered to be a through state and the selector 11 selects the output from the n-th flip-flop circuit 2.

Furthermore, the value of the second bypass signal 18 is set such that the second latch circuit 10 is rendered to be a hold state and the selector 12 selects the output from a flip-flop other than the m-th flip-flop 4, i.e. the output from the selector 11.

In this state, the scanning test pattern data is input from the scanning-in terminal 14. At the time the n clock signals are inputted from the clock signal terminal 15, the test data input d is supplied from the n-th flip-flop circuit 2 to the input terminal of the inverter 29, and the test data output g is outputted from the output terminal of the inverter 29.

At the time of outputting data g from the scan-out terminal 16, by setting the first and second bypass signals 17 and 18 at the inverse logic levels to the aforementioned logic levels, data are output. Specifically, the value of the first bypass signal is set such that the first latch circuit 9 is rendered to be a hold state and the selector 11 selects the scanning-in 14. The value of the second bypass signal 18 is set such that the second latch circuit 10 is rendered to be a through state and the selector 12 selects the output from the m-th flip-flop 4.

The test data output g 26 from the inverter 29 is inputted to the m-th flip-flop circuit 4 via the m-th selector 8, and is outputted to the scanning-out terminal 16 via the selector 12.

In the test for an inverter, two tests of "0" and "1" are necessary. In this embodiment, therefore, 2×(m+1) clock signals, that is, 2 (n+(m−n)+1), are required. On the other hand, in the foregoing semiconductor integrated logic circuit shown in FIG. 2, 2×(2m+1) clock signals are required.

In this embodiment shown in FIG. 1, the selector is inserted between the shift registers constituting the scanning pass test circuit. The shift register constituting the scanning pass is divided into two portions. It is a matter of course that the number of the clock signals is much reduced by dividing the shift register into more than two parts.

In the foregoing embodiment, the first and second latch circuits 9 and 10 are used, which are rendered to be a hold state when their gate terminals are inactive. With these latch circuits 9 and 10, the first and second flip-flop groups 1 to 4 constituting the shift register may be either a positive-inversion flip-flop or a negative-inversion flip-flop, the positive-inversion flip-flop fetching data at a rising edge of clock signals and the negative-inversion flip-flop fetching data at a falling edge of the clock signals. As mentioned above, the present invention was explained in conformity with the foregoing embodiment. The present invention is not limited to the foregoing embodiment. It is a matter of course that various embodiments may be included according to the present invention.

As described above, according to the present invention, the selector is inserted in the shift register composed of the flip-flop circuits constituting the scanning pass test circuit, and the latch circuit is connected to the clock terminal of each of the flip-flop circuits. With such simple circuit constitution, the number of the clock signals is reduced to less than half. As a result, the present invention exhibits an advantage that the number of the scanning pass test patterns are greatly reduced.

According to the present invention, the clock signals supplied to the flip-flop circuits divided into the groups are controlled via the latch circuits. Therefore, it is possible to suppress the unnecessary operations of the flip-flop circuits, and to avoid the operations of the circuits other than the tested object circuit in the combination. As a result, it is possible to perform a high precision test by reducing switching noise.

What is claimed is:

1. A scanning pass test circuit comprising:

a scan-in terminal;

a scan-out terminal;

a plurality of flip-flops connected together in series, wherein said plurality of flip-flops are divided into groups to form a first shift register and a second shift register;

first means for selectively connecting said scan-in terminal with an input node of either of said first and second shift registers for shifting input data inputted to said scan-in terminal;

second means for selectively connecting said scan-out terminal with an output node of said first shift register when said first means connects said scan-in terminal with an input of said first shift register, and for selectively connecting said scan-out terminal with an output node of said second shift register when said first means connects said scan-in terminal with an input of said second shift register; and third means for supplying a shift clock to said first shift register and not supplying said shift clock to said second shift register when said first means connects said scan-in terminal with said input of said first shift register.

2. The scanning pass test circuit as claimed in claim 1 further comprising fourth means for setting a content of either of said first and second shift registers to an output value from a combination circuit before either of said first and second shift registers shift said content out to said scan-out terminal.

3. The scanning pass test circuit as claimed in claim 1, wherein said third means comprises latch circuits for receiving said shift clock and one of a plurality of bypass control signals, wherein said latch circuits output said shift clock or hold said shift clock according to a logic level of said one of said bypass control signals.

4. A scanning pass test circuit for testing a combination circuit comprising:

a shift register connected to an output selector, wherein said output selector includes a first input connected with an output of said shift register and a second input connected with an input of said shift register; and shift clock supply means, attached to said shift register for supplying a series of shift clocks thereto, wherein said shift clock supply means supplies said shift clock to said and when said output selector selects said first input and does not supply said shift clock to said shift register when said output selector selects said second input.

5. The scanning pass test circuit as claimed in claim 4, wherein said shift clock supply means comprises a latch circuit receiving said shift clock and a control signals.

* * * * *